(12) United States Patent
Kim et al.

(10) Patent No.: US 10,374,630 B2
(45) Date of Patent: Aug. 6, 2019

(54) LOW-DENSITY PARITY CHECK DECODER, A STORAGE DEVICE INCLUDING THE SAME, AND A METHOD

(71) Applicant: SAMSUNG ELECTRONICS CO., LTD., Suwon-si, Gyeonggi-Do (KR)

(72) Inventors: Jiyoup Kim, Suwon-si (KR); Dong-Min Shin, Seoul (KR); Beomkyu Shin, Seongnam-si (KR); Junjin Kong, Yongin-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 27 days.

(21) Appl. No.: 15/652,260

(22) Filed: Jul. 18, 2017

(65) Prior Publication Data

US 2018/0026659 A1  Jan. 25, 2018

(30) Foreign Application Priority Data

Jul. 19, 2016  (KR) .......................... 10-2016-0091536

(51) Int. Cl.
| | | |
|---|---|---|
| *G06F 11/10* | (2006.01) | |
| *G11C 11/56* | (2006.01) | |
| *G11C 29/52* | (2006.01) | |
| *H03M 13/00* | (2006.01) | |
| *H03M 13/11* | (2006.01) | |
| *H03M 13/37* | (2006.01) | |

(52) U.S. Cl.
CPC ..... *H03M 13/1111* (2013.01); *G06F 11/1012* (2013.01); *G06F 11/1068* (2013.01); *G11C 11/5642* (2013.01); *G11C 29/52* (2013.01); *H03M 13/1108* (2013.01); *H03M 13/3707* (2013.01); *H03M 13/3723* (2013.01); *H03M 13/3746* (2013.01); *H03M 13/6325* (2013.01); *H03M 13/116* (2013.01); *H03M 13/1188* (2013.01)

(58) Field of Classification Search
CPC ...................... H03M 13/1111; G11C 11/5642; G11C 29/52; G06F 11/1068
See application file for complete search history.

(56) References Cited

U.S. PATENT DOCUMENTS

| | | |
|---|---|---|
| 7,673,223 B2 | 3/2010 | Richardson et al. |
| 7,679,133 B2 | 3/2010 | Son et al. |
| 7,886,208 B2 | 2/2011 | Moon et al. |

(Continued)

OTHER PUBLICATIONS

Juntang Zhang et al., "Shuffled Iterative Decoding", IEEE Transactions on Communications, vol. 53, No. 2, Feb. 2005, pp. 209-213.

(Continued)

*Primary Examiner* — Thien Nguyen
(74) *Attorney, Agent, or Firm* — Volentine, Whitt & Francos, PLLC

(57) ABSTRACT

A low-density parity check (LDPC) decoder may include a variable node processing unit and a check node processing unit. The check node processing unit includes memory elements storing a check node value. The memory elements are interconnected through two or more paths, and each of the paths may include a total or partial cyclic permutation of the memory elements to transmit the check node value.

18 Claims, 10 Drawing Sheets

(56) References Cited

U.S. PATENT DOCUMENTS

| | | | |
|---|---|---|---|
| 8,161,345 B2 | 4/2012 | Graef | |
| 8,281,205 B2 | 10/2012 | Yokokawa | |
| 8,489,962 B2 | 7/2013 | Dielissen | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,656,250 B2 | 2/2014 | Gunnam et al. | |
| 9,244,685 B2 | 1/2016 | Li et al. | |
| 2006/0136799 A1* | 6/2006 | Choi | H03M 13/11 714/752 |
| 2011/0010602 A1* | 1/2011 | Chung | H03M 13/1134 714/752 |
| 2011/0233648 A1 | 9/2011 | Seol et al. | |
| 2012/0246536 A1* | 9/2012 | Ng | H03M 13/114 714/752 |
| 2014/0298142 A1 | 10/2014 | Sakau et al. | |
| 2015/0067440 A1 | 3/2015 | Owen et al. | |
| 2015/0143194 A1 | 5/2015 | Nemati Anaraki et al. | |
| 2015/0303942 A1* | 10/2015 | Zhang | H03M 13/1105 714/763 |

OTHER PUBLICATIONS

Kin-Chu Ho et al., "A 520k (18900, 17010) Array Dispersion LDPC Decoder Architectures for NAND Flash Memory", IEEE Transactions on Very Large Scale Integration (VLSI) Systems, vol. 24, No. 4, Apr. 2016.

Jin Sha et al., "Multi-Gb/s LDPC Code Design and Implementation", IEEE Transactions on Very Large Scale Integration (VLSI) Systems, vol. 17, No. 2, Feb. 2009, pp. 262-268.

* cited by examiner

| Composition | Period | Cycle |
|---|---|---|
| $\sigma\tau$ | 15 | 30 |
| $\sigma^2\tau$ | 13 | 39 |
| $\sigma\tau^2$ | 45 | 135 |
| $\sigma^3\tau$ | 15 | 60 |
| $\sigma^2\tau^2$ | 15 | 60 |
| $\sigma\tau^3$ | 15 | 60 |
| $\sigma^4\tau$ | 11 | 55 |
| $\sigma^3\tau^2$ | 35 | 175 |
| $\sigma^2\tau^3$ | 15 | 75 |
| $\sigma\tau^4$ | 15 | 75 |

| Composition | Period | Cycle |
|---|---|---|
| $\sigma^{i3}\tau^{i}$ | 11 | 44 |
| $\sigma^{i2}\tau^{i}$ | 12 | 36 |
| $\tau$ | 15 | 15 |

LOW-DENSITY PARITY CHECK DECODER, A STORAGE DEVICE INCLUDING THE SAME, AND A METHOD

CROSS-REFERENCE TO RELATED APPLICATIONS

This US non-provisional patent application claims priority under 35 U.S.C. § 119 to Korean Patent Application No. 10-2016-0091536, filed on Jul. 19, 2016, the entirety of which is hereby incorporated by reference herein.

TECHNICAL FIELD

The inventive principles and concepts relate generally to error correction techniques and, more particularly, to a low-density parity check (LDPC) decoder and a storage device including the same.

BACKGROUND

The reliability of memory devices is degraded due to the fine process by which they are made and due to their incorporation of multi-level cells (MLCs) for increasing the integration density of the memory devices. The fine process causes the circuit linewidth to be reduced, which leads to the cells being vulnerable to cell-to-cell interference. The use of MLCs causes spacing between levels to be reduced, which increases an overlap area between adjacent levels that can degrade reliability. In the situation where errors of a memory device itself have increased, an error correction code (ECC) technique should be used to ensure a high level of reliability of a data storage device incorporating one or more of the memory devices. In recent years, many studies have been conducted on an LDPC decoder to enhance an ECC function of read performance of a NAND flash memory device. Such LDPC decoders are currently used in flash memory devices for this purpose.

SUMMARY

The present disclosure relates to an LDPC decoder, a storage device including the LDPC decoder, and a method for performing a read operation in a storage device that includes the LDPC decoder.

The LDPC decoder comprises a variable node processing unit (VNU) configured to receive channel information and check node information and to calculate variable node information, a check node processing unit (CNU) configured to receive the variable node information and to calculate check node information, and a memory configured to temporarily store data generated during operations of the VNU and of the CNU. The CNU includes a plurality of memory elements to store a corresponding check node value. The memory elements are interconnected through two or more paths, each of which includes a total or partial cyclic permutation of the memory elements to transmit the check node value.

The storage device comprises at least one nonvolatile memory (NVM) device configured to store a codeword including information and a parity corresponding to the information and a memory controller including an LDPC decoder configured to read the codeword from the NVM device and to correct an error of the read codeword. The LDPC decoder comprises a VNU configured to receive channel information and check node information corresponding to the codeword and to update variable node information and a CNU configured to receive the variable node information and to update check node information. At each clock cycle of a clock of the LDPC decoder, the CNU changes a sequence or position of check node information stored in corresponding first memory elements of the CNU through a first interconnection of the first memory elements or changes a sequence or position of check node information stored in corresponding second memory elements of the CNU through a second interconnection of the second memory elements of the CNU.

The method comprises steps of:
performing hard decision memory sensing in the storage device;
transmitting read data from a non-volatile memory (NVM) device of the storage device to an error correction circuit of a memory controller of the storage device;
in a low-density parity check (LDPC) decoder of the error correction circuit, using LDPC decoding to make a hard decision on the read data;
in the LDPC decoder, determining whether the hard decision was successfully made;
if a determination is made that the hard decision was not successfully made, performing soft decision memory sensing on the read data;
transmitting the read data from the NVM device to the error correction circuit of the memory controller;
in the LDPC decoder of the error correction circuit, performing a soft decision using LDPC decoding on the read data; and
in the LDPC decoder, determining whether the soft decision was successfully made. The LDPC decoder has a VNU and a CNU. The CNU includes a plurality of memory elements interconnected through two or more paths, each of which includes a total or partial cyclic permutation of the memory elements to transmit a check node value when performing LDPC decoding to make the hard and soft decisions.

These and other features and benefits of the inventive principles and concepts will become apparent from the following description, drawings and claims.

BRIEF DESCRIPTION OF THE DRAWINGS

In the following description, representative embodiments that embody inventive principles and concepts will be described with reference to the accompanying drawings in which like reference numbers refer to like elements, features or components throughout the different views. The drawings are not necessarily to scale, emphasis instead being placed upon illustrating inventive principles and concepts. In the drawings.

DETAILED DESCRIPTION

A low-density parity check (LDPC) decoder according to an exemplary, or representative, embodiment of the inventive principles and concepts is provided that includes an interconnection of memory elements corresponding to a check node processing unit and/or a variable node processing unit (the interconnection being also referred to as "variable interconnection"). The variable interconnection includes at least two paths to simplify an interconnection between the check node processing unit and the variable node processing unit (the interconnection being also referred to as "fixed interconnection") and to support various H matrices (or decoding matrices).

Figure 1:
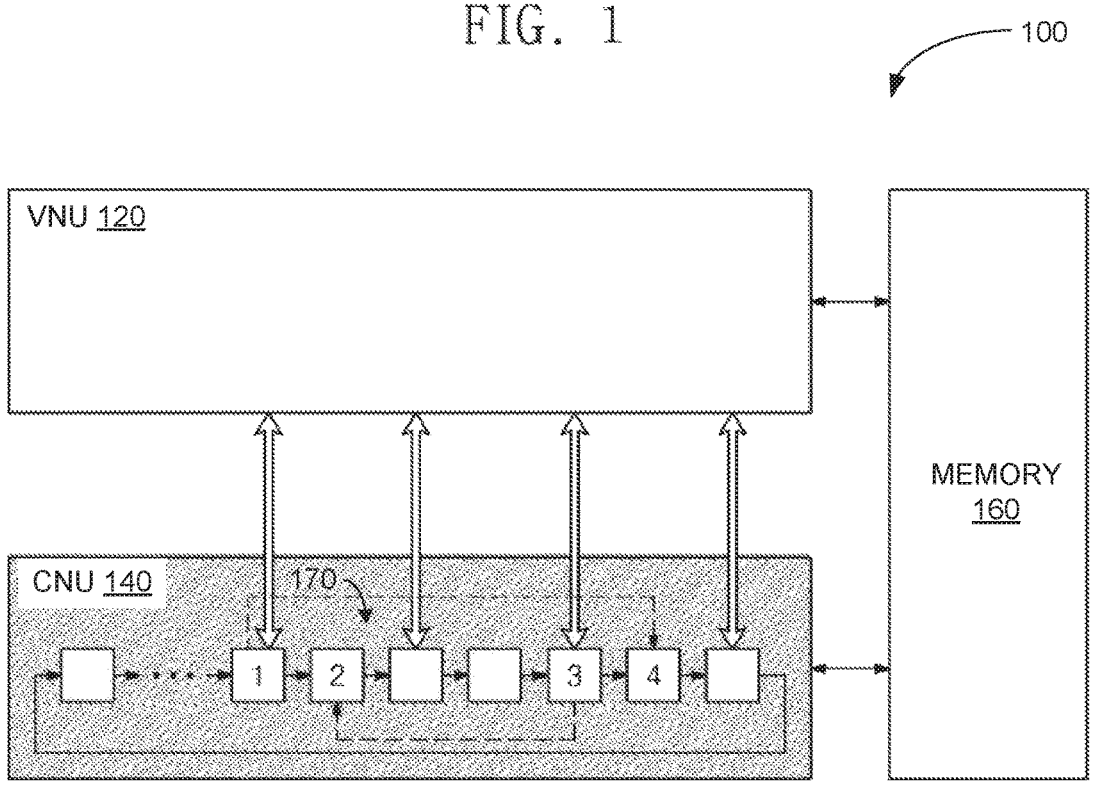
FIG. 1 illustrates an LDPC decoder according to a representative embodiment.

FIG. 1 illustrates an LDPC decoder 100 according to a representative embodiment. As illustrated, in accordance with this embodiment, the LDPC decoder 100 includes a variable node processing unit (VNU) 120, a check node processing unit (CNU) 140, and a memory 160.

In some embodiments, the VNU 120 includes a plurality of variable nodes. In some embodiments, the VNU 120 includes a first memory element corresponding to each of the variable nodes.

In some embodiments, the CNU 140 includes a plurality of check nodes. In some embodiments, the CNU 140 includes a second memory element corresponding to each of the check nodes.

In some embodiments, an interconnection between the VNU 120 and the CNU 140 is fixed in a special form. For example, in some embodiments only some, i.e., fewer than all, of the plurality of check nodes of the CNU 140 are interconnected to the variable nodes of the VNU 120.

In some embodiment, the CNU 140 includes memory elements 170 (squares shown in FIG. 1) that are interconnected via two paths.

In some embodiments, each of the memory elements 170 is used to calculate a check-to-variable (C2V) message from a variable-to-check (V2C) message received from the VNU 120. Each of the memory elements 170 may store information used to calculate a C2V message of a corresponding check node.

Each memory element 170 may be implemented as a storage device, such as a register or a flip-flop, for example. For example, if a min sum algorithm (MSA) is used for LDPC decoding, a memory element 170 of the CNU 140 may store a first minimum (min1), a second minimum (min2), and minimum position information (min position) that are used to calculate a C2V message.

In some embodiments, a value of each of the memory elements 170 of the CNU 140 shifts in a direction indicated by a solid arrow at each clock cycle, which will be referred to hereinafter as "cyclic shift". Thus, a memory element 170 of the CNU 140 may store values corresponding to different check nodes at each clock cycle (e.g., in the case of a decoder using an MSA, the stored value is referred to as min1, min2, min position or "check node information" of each of the check nodes).

In some embodiments, a value of each of the memory elements 170 of the CNU 140 may be used to calculate a C2V message value together with the V2C message received from the VNU 120 at each clock cycle. Thus, the C2V message may be calculated in the CNU 140 at each clock cycle and the calculated C2V message may be transmitted to the VNU 120.

In some embodiments, the VNU 120 processes the C2V message received from the CNU 140 to calculate the V2C message. The calculated V2C message may be retransmitted to the CNU 140.

In some embodiments, the CNU 140 combines the V2C message transmitted from the VNU 120 with the values stored in the memory elements 170 of the CNU 140 to update the values of the memory elements 170. For example, when decoding is performed using an MSA, the V2C message transmitted from the VNU 120 may be used to update a first minimum (min1), a second minimum (min2), and first minimum position information (min1 position) of a check node. When the transmitted V2C message is smaller than the min1 stored in the memory element 170, the min1 may be changed to the transmitted V2C message, the min2 may be changed to pre-updated min1, and the min1 position may be adjusted to a variable node position that is being processed.

The memory 160 may be used to temporarily store data required to perform an operation of the VNU 120 and/or the CNU 140. For example, the memory 160 may store a codeword, a V2C message, a C2V message, an intermediate value, a final value, and the like to perform LDPC decoding.

As shown in FIG. 1, the CNU 140 typically includes a plurality of memory elements 170, but may include a single memory element 170, or may not include memory elements at all, in which case the memory elements may may be external to the CNU 140. For example, the memory elements may be provided inside of the memory 160.

In the LDPC decoder 100, an interconnection between the VNU 120 and the CNU 140 is fixed. Accordingly, the LDPC decoder 100 does not need a complex interconnection circuit such as that required in a typical LDPC decoder.

In the LDPC decoder 100, updating of a memory element 170 is performed only at the memory elements 170 of the CNU 140 interconnected with the VNU 120, except for a simple cyclic shift. Thus, logic required for performing an updating operation may be significantly reduced as compared to a typical LDPC decoder. That is, updating operation logic may be employed only at a memory element 170 of the CNU 140 that is interconnected with the VNU 120.

Even when transmitting a C2V message from the CNU 140 to the VNU 120, the LDPC decoder 100 preferably calculates the C2V message only at the memory element 170 of the CNU 140 that is interconnected with the VNU 120. Thus, logic in the CNU 140 associated with the calculation of the C2V message may be significantly reduced as compared to a typical LDPC decoder. That is, the logic associated with the calculation of the C2V message may be employed only at the memory element 170 of the CNU 140 that is interconnected with the VNU 120.

As described above, the LDPC decoder 100 may employ only as much logic associated with the C2V message and check node information (e.g., min1, min2, min1 position in the case of MSA) as the number of the memory elements 170 of the CNU 140 that are interconnected with the VNU 120. This significantly reduces the amount of area that is consumed by the LDPC decoder 100 compared to a typical LDPC decoder, which requires logic associated with the memory elements of all check nodes.

Continuing to refer to FIG. 1, when check node values of the memory elements 170 of the CNU 140 move along a solid line at each clock cycle, the sequence of check nodes connected to the VNU 120 through an interconnection may be maintained as it is. On the other hand, the sequence of check nodes stored in the memory elements 170 of the CNU 140 may be changed by adding interconnections between memory elements 170 of the CNU 140 indicated by dotted lines. Thus, the LDPC decoder 100 may vary a pattern of an H matrix that is used for LDPC decoding.

As shown in FIG. 1, there are interconnections between the memory elements 170 of the CNU 140. An interconnection indicated by a dotted line is a path that is intentionally added to change the sequence of the check nodes. In FIG. 1, a path to move from one of the memory elements 170 labeled 1 in the next clock cycle may be to either of the memory elements 170 labeled 2 or 4. At the same time, a path to move from one of the memory elements 170 labeled 3 in the next clock cycle may be to either of the memory elements 170 labeled 2 or 4. In the case that paths are selected in the sequence of 1→2→→3→4, the case is identical to the case that there is no additional interconnection. On the other hand, in the case that the paths are selected in the sequence of 1→4→3→2, the check node values may move to the memory elements 170 of the CNU 140 along a path which is different from an existing path.

As described above, the additional interconnection of the CNU 140 of the LDPC decoder 100 may be implemented very simply. Thus, the degree of freedom of implementing an H matrix may be increased greatly compared to cases in which the LDPC decoder has no additional interconnection. This is because the check node sequence processed in the CNU 140/VNU 120 of the LDPC decoder 100 may be varied by differently setting two types of path patterns between memory elements at each clock cycle. Thus, the LDPC decoder 100 may be configured to support an H matrix having no restriction in code rate, correction ability, and decoding convergence speed, with only a minimal increase in complexity.

For example, to implement a 15-by-145 H matrix without an additional interconnection, which is the case with the typical LDPC decoder, the number of columns may be a multiple of the number of rows. Accordingly, it is very difficult to implement the 15-by-145 H matrix without an additional interconnection. This is because check node values stored in a memory element of a CNU of an LDPC decoder should return to the original sequence following a clock cycle corresponding to one iteration, and this period is equal to the number of check nodes. Thus, in the case of the typical LDPC decoder in which there is no additional interconnection, 150 clock cycles could be consumed in order to support the 15-by-145 H matrix.

However, according to the LDPC decoder 100 and the decoding method performed thereby, the sequence of check node information stored in the memory elements 170 of the CNU 140 can be changed at each clock cycle to generate a check node sequence pattern having a much larger number of periods. As a result, an H matrix of various numbers of columns can be supported by the LDPC decoder 100. For example, if there is a pattern to restore the sequence of check nodes stored in the memory elements 170 of the CNU 140 to an original sequence, an H matrix having as many columns as corresponding clock cycles can be supported by the LDPC decoder 100.

Figure 2:
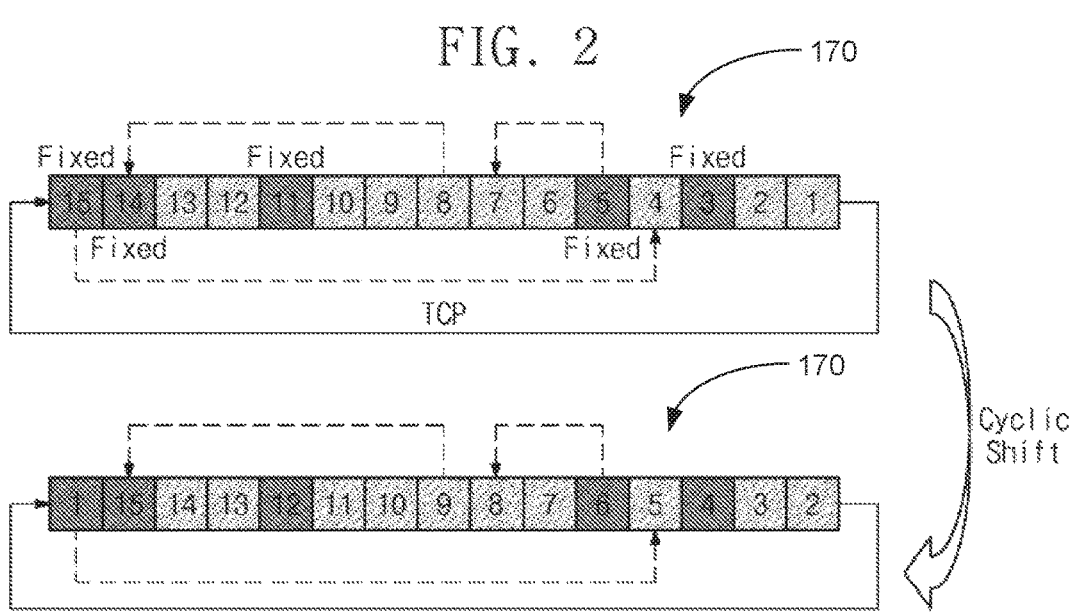
FIG. 2 illustrates a first permutation (τ) including an interconnection of a memory device of a CNU of the LDPC decoder shown in FIG. 1 for supporting an H matrix according to a representative embodiment.

FIG. 2 illustrates a first permutation ($\tau$) including an interconnection of the memory elements 170 of the CNU 140 for supporting an H matrix according to a representative embodiment. For exemplary purposes, it will be assumed that the CNU 140 has fifteen memory elements 170. However, it is to be understood that the number of the memory elements 170 is not limited to fifteen.

In the discussion that follows, the individual memory elements 170 are labeled with numerals 1 through 15 in order to conceptually demonstrate a process of transmitting a value stored in a memory element.

Each of the memory elements 170 transmits a value from left to right at each clock cycle. Each of the memory elements 170 labeled 15, 14, 11, 5, and 3 is a memory element of the CNU 140 that is interconnected with the VNU 120 (see FIG. 1). Movement of a value of a check node defined at a path may be considered a permutation defined on a set {1, 2, . . . , 14, 15}. For example, the first permutation ($\tau$) shown in FIG. 2 corresponds to (15, 14, 13, 12, 11, 10, 9, 8, 7, 6, 5, 4, 3, 2, 1). The first permutation ($\tau$) may be a total cyclic permutation (TCP) formed by all the memory elements 170 labeled 15 to 1. In accordance with this representative embodiment, each of the memory elements 170 labeled 15, 14, 11, 5, and 3 is fixedly interconnected with the VNU 120.

Figures 3, 4:
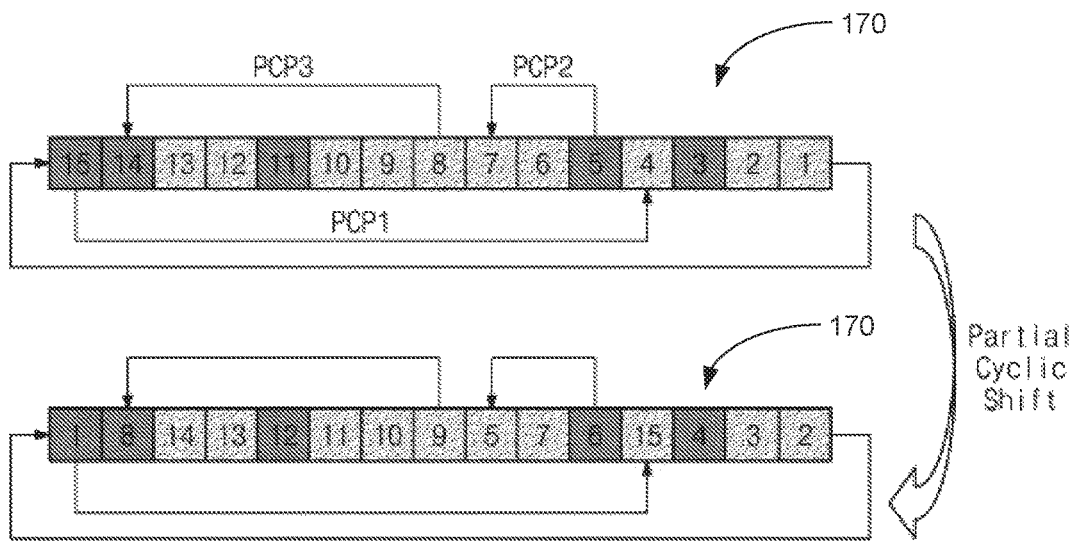
FIG. 3 illustrates a second permutation (σ) including an interconnection of a memory device of a CNU of the LDPC decoder shown in FIG. 1 for supporting an H matrix according to a representative embodiment.
FIG. 4 illustrates periods of permutation composition patterns and cycles required to restore a state of a check node memory element to an original state according to a representative embodiment.

FIG. 3 illustrates a second permutation ($\sigma$) including an interconnection of memory elements 170 of the CNU 140 for supporting an H matrix according to another representative embodiment. The second permutation ($\sigma$) corresponds to (15, 4, 3, 2, 1), (7, 6, 5), and (14, 13, 12, 11, 10, 9, 8). The second permutation ($\sigma$) may include a first cyclic permutation PCP1 formed by the five memory elements 170 that are labeled 15, 4, 3, 2, and 1, a second cyclic permutation PCP2 formed by three memory elements 170 that are labeled 7, 6, and 5, and a third cyclic permutation PCP3 formed by seven memory elements 170 that are labeled 14, 13, 12, 11, 10, 9, and 8. Each of the first, second, and third cyclic permutations PCP1, PCP2, and PCP3 includes a subset, i.e., fewer than all, of the memory elements 170. Below, the cyclic permutation will be referred to as a "partial cyclic permutation".

To sum up FIGS. 2 and 3, the first permutation ($\tau$) shown in FIG. 2 includes the total cyclic permutation (TCP) including all memory elements 170 of the CNU 140 and the second permutation ($\sigma$) shown in FIG. 3 include at least two partial cyclic permutations (PCPs) including respective subsets of the memory elements 170 of the CNU 140.

An H matrix required for LDPC decoding according to representative embodiments may be used to adjust periods of memory elements of the CNU 140 by combining the first permutation (τ) corresponding to the first path shown in FIG. 2 with the second permutation (σ) corresponding to the second path shown in FIG. 3. For example, a pattern used to execute a cycle m times in a first path state corresponding to FIG. 2 and to execute a cycle n times in a second path state corresponding to FIG. 3 may be expressed as $\sigma^n \tau^m$.

FIG. 4 illustrates periods of permutation composition patterns and cycles required to restore a state of a check node memory element to an original state according to a representative embodiment.

Since a period of the first permutation (τ) is 15 in this example, $60(\sigma^3\tau)+15(\tau)+55(\sigma^4\tau)+15(\tau)=145$. Following 145 cycles, a state of a memory element of a check node is restored to an original state. When shuffled decoding is used in 15-by-145 H matrix decoding, a minimum cycle is 145. Thus, if a permutation composition pattern according to a representative embodiment is used, one iteration may be performed using the minimum cycle.

In some cases, in order to achieve LDPC encoding efficiency, a parity block portion of the H matrix may be in a dual diagonal form. For example, when the 15-by-145 H matrix is formed in such a manner that $60(\sigma^3\tau)+15(\tau)+55(\sigma^4\tau)+15(\tau)=145$, original states of memory elements are restored following 60, 15, 55, and 15 cycles, respectively.

Figure 5:
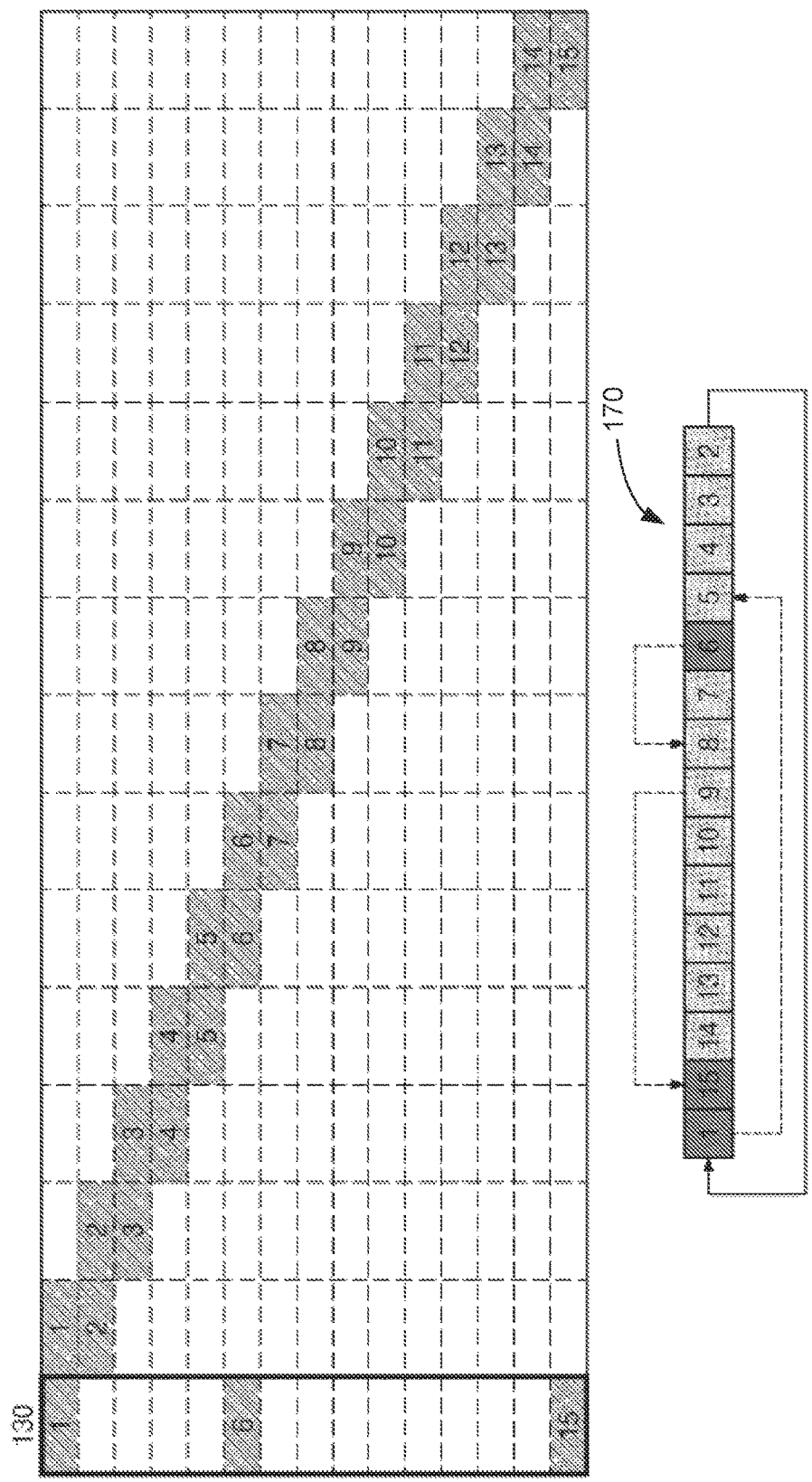
FIG. 5 illustrates a process of generating an H matrix of dual diagonal type in 0 cycle and 130 cycle of the LDPC decoder shown in FIG. 1 according to a representative embodiment.

FIG. 5 illustrates a process of generating an H matrix of dual diagonal type in cycles 0 and 130 of the LDPC decoder 100 according to a representative embodiment. Referring to FIG. 5, if memory elements 170 are configured to restore an original sequence following 130 cycles when the sequence of the memory elements is 1, 15, 14, 13, . . . , 4, 3, 2 in cycle 0, the original sequence of the memory elements is 1, 15, 14, 12, . . . , 4, 3, 2. The period of 130 cycles may be achieved using a permutation of 60+15+55=130. The check node values move using the first permutation (τ) during 15 cycles, and the memory elements 170 labeled 1, 2, and 11 of the CNU 140 are used at 130 cycles.

Figure 6:
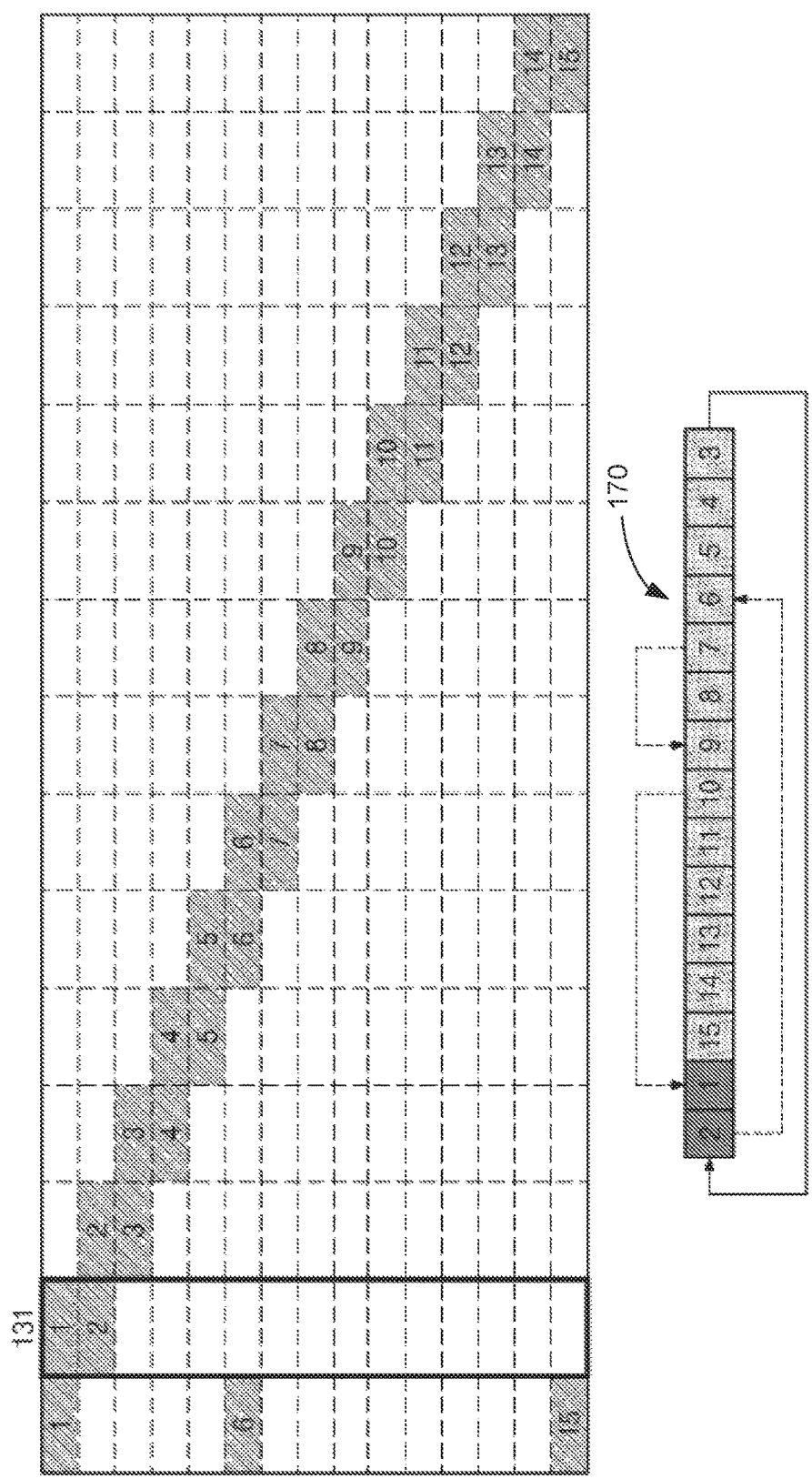
FIG. 6 illustrates a process of generating an H matrix of dual diagonal type at 131 cycle of the LDPC decoder shown in FIG. 1 according to a representative embodiment.

FIG. 6 illustrates a process of generating an H matrix of dual diagonal type at 131 cycles of the LDPC decoder 100 according to a representative embodiment. Referring to FIG. 6, the number of check nodes connected to a variable node is two, which is different from the number of the check nodes shown in FIG. 5. That is, at 131 cycles, two memory elements 170 of the CNU 140 labeled 2 and 1 are connected to corresponding check nodes.

Figure 7:
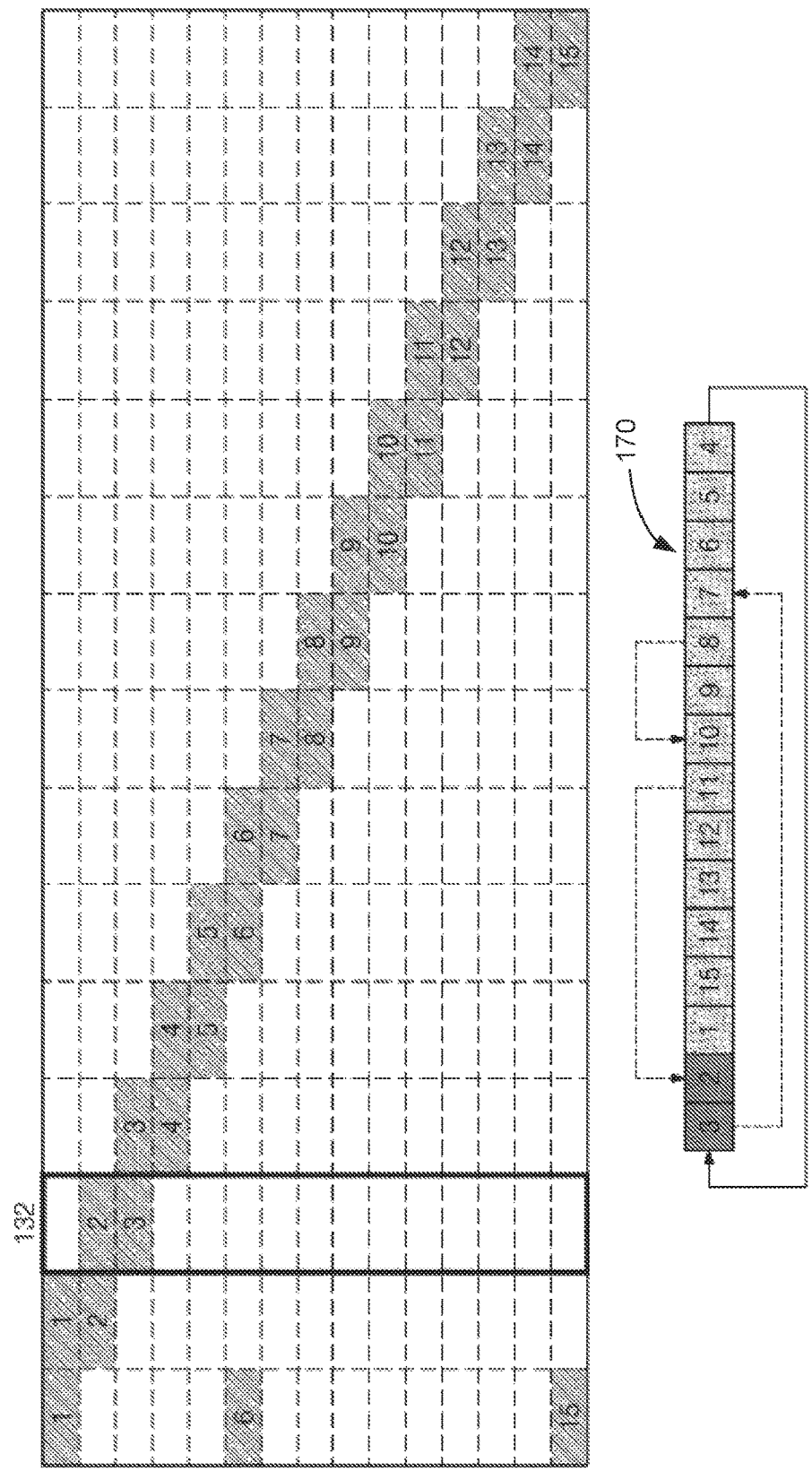
FIG. 7 illustrates a process of generating an H matrix of dual diagonal type in 132 cycle of the LDPC decoder shown in FIG. 1 according to a representative embodiment.

FIG. 7 illustrates a process of generating an H matrix of dual diagonal type at 132 cycles of the LDPC decoder 100 according to a representative embodiment. Referring to FIG. 7, at 132 cycles, two of the memory elements 170 of the CNU 140 labeled 3 and 2 are connected to corresponding check nodes.

To sum up the processes depicted in FIGS. 6 and 7, an H matrix of dual diagonal type may be implemented using only two of the memory elements 170 of the CNU 140 from 131 cycles to 144 cycles.

The CNU 140 of the LDPC decoder 100 according to representative embodiments has an additional path in order to achieve a multi-overhead configuration, as will now be described with reference to FIGS. 8-11.

Figure 8:
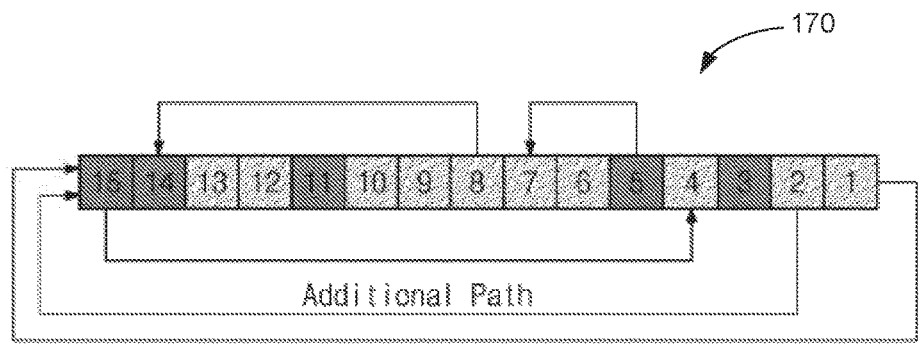
FIG. 8 illustrates an additional path of a memory element of the CNU of the LDPC decoder shown in FIG. 1 supporting a multi-overhead implementation according to a representative embodiment.

FIG. 8 illustrates an additional path of the memory elements 170 of the CNU 140 for achieving a multi-overhead configuration according to a representative embodiment. Referring to FIG. 8, the memory elements 170 include an additional path indicated by the solid arrow directed from one of the memory elements 170 labeled 2 to another of the memory elements 170 labeled 15. Thus, both a 15-by-145 H matrix and a 14-by-145 H matrix are supported.

In example embodiments, memory elements may be interconnected to transmit a check node value to an additional permutation, and the additional permutation may include a total cyclic permutation formed by a subset of the memory elements 170 whose number is smaller than the total number of the memory elements 170.

Figure 9:
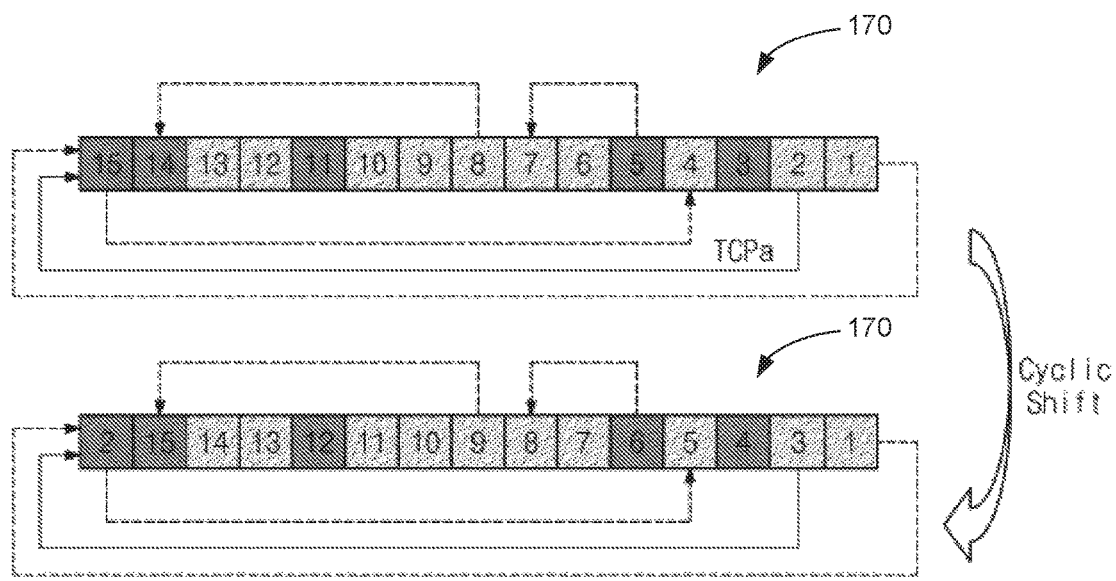
FIG. 9 illustrates a first additional permutation ($\tau'$) depending on the additional path in FIG. 8.

FIG. 9 illustrates a first additional permutation (τ') depending on the additional path in FIG. 8. Referring to FIG. 9, the first additional permutation (f) may include a total cyclic permutation TCPa including fourteen of the memory elements labeled 15, 14, 13, 12, 11, 10, 9, 8, 7, 6, 5, 4, 3, and 2.

Figures 10, 11:
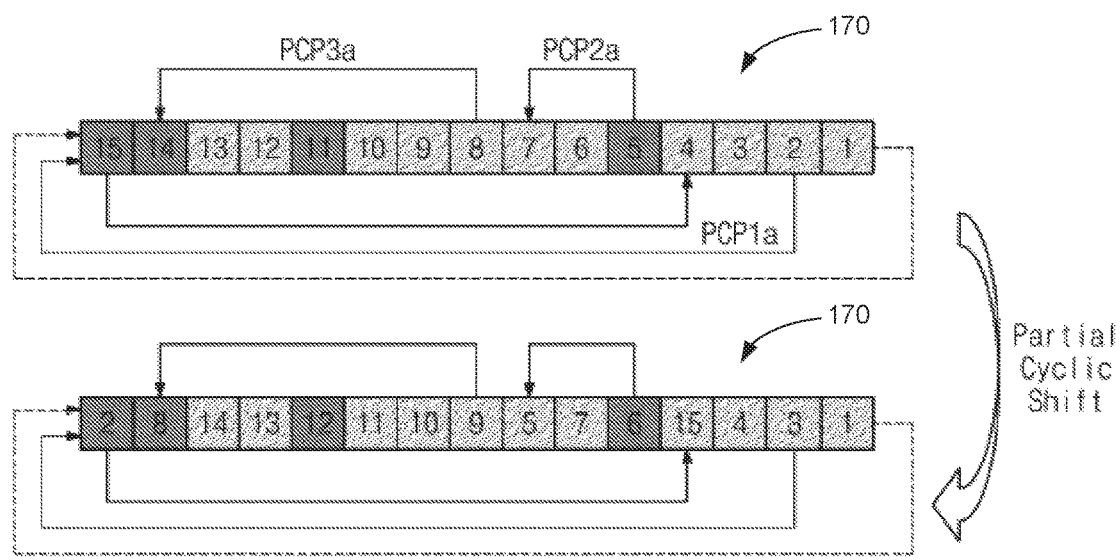
FIG. 10 illustrates a second additional permutation ($\sigma'$) depending on the additional path in FIG. 8.
FIG. 11 illustrates permutation compositions for an H matrix supporting a multi-overhead implementation of the LDPC decoder shown in FIG. 1 according to a representative embodiment.

FIG. 10 illustrates a second additional permutation (σ') depending on the additional path in FIG. 8. Referring to FIG. 10, the second additional permutation (σ') may include a first partial cyclic permutation PCP1a including four of the memory elements labeled 15, 4, 3, and 2, a second partial cyclic permutation PCP2a including three of the memory elements 170 labeled 7, 6, and 5, and a third partial cyclic permutation PCP3a including seven of the memory elements labeled 14, 13, 12, 11, 10, 9, and 8.

As described above, to form a 14-by-145 H matrix of dual diagonal type while achieving 145 cycles through one iteration, a switching pattern is used to restore a state of a memory element of a check node following 131 cycles. This may be implemented by applying the first permutation (τ), the first additional permutation (τ') in FIG. 9, and the second additional permutation (σ') in FIG. 10.

FIG. 11 illustrates permutation compositions for an H matrix supporting a multi-overhead configuration of the LDPC decoder 100 according to a representative embodiment. Referring to FIG. 11, a pattern to restore an original state during 131 cycle may be formed by combining the permutations (τ, τ', and σ') in FIGS. 2, 9, and 10.

For example, by combining $36(\sigma'^2\tau')+15(\tau)+44(\tau'^3\sigma')+36(\sigma'^2\tau')+14(\tau')=145$, a 14-by-145 H matrix can be formed while maintaining a dual diagonal state.

The LDPC decoder 100 according to a representative embodiment is used as an error correction code of a storage device, as will now be described with reference to FIG. 12.

Figure 12:
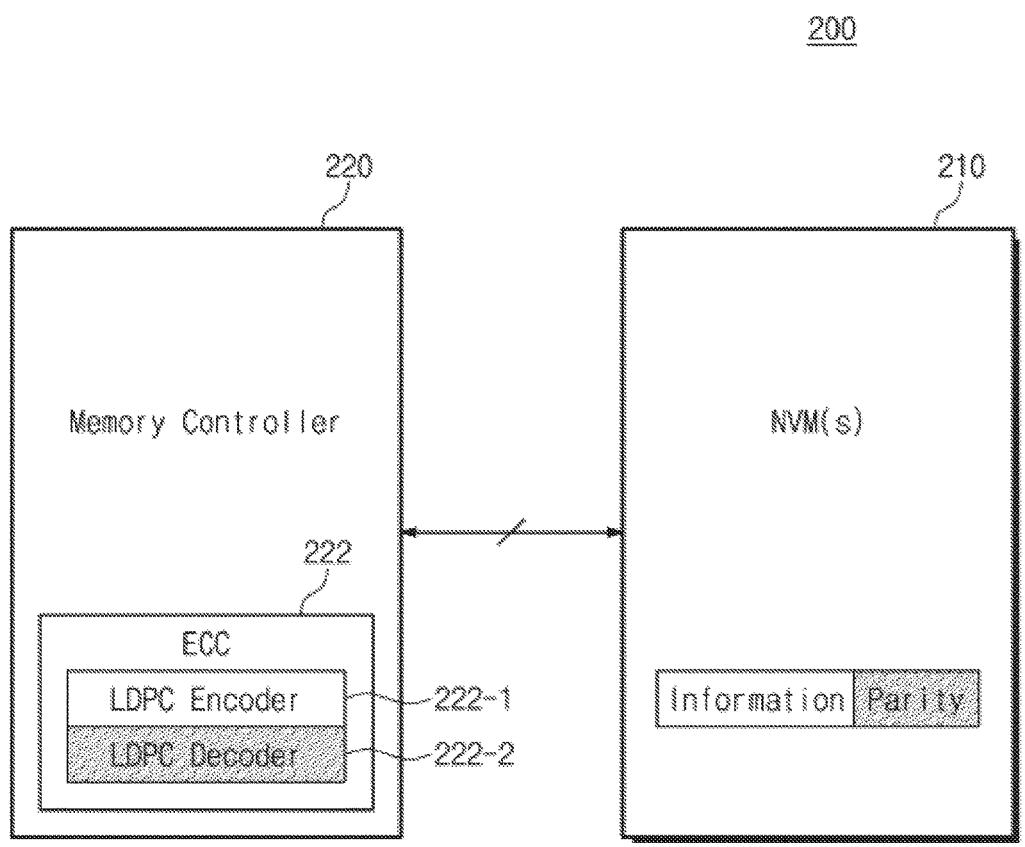
FIG. 12 illustrates a storage device that incorporates the LDPC decoder shown in FIG. 1 according to a representative embodiment.

FIG. 12 illustrates a storage device 200 according to a representative embodiment. As illustrated, the storage device 200 includes at least one nonvolatile memory (NVM(s)) 210 and a memory controller 220 to control the nonvolatile memory 210. The nonvolatile memory 210 may be implemented to store information and a parity corresponding to the information. The parity may include an error correction code (ECC).

In some embodiments, the NVM(s) 210 includes a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), a thyristor random access memory (TRAM), or the like.

In some embodiments, the NVM(s) 210 is implemented with a three-dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic," as that term is used herein, means that layers of each level of the array are directly deposited on the layers of each underlying level of the array.

In accordance with a representative embodiment, the 3D memory array includes vertical NAND strings that are vertically oriented such that one or more of the memory cells is located over one or more of the other memory cells. At least one of the memory cells may comprise a charge trap layer. Each vertical NAND string may include at least one select transistor located over one or more of the memory cells, having the same structure as the memory cells and being formed monolithically together therewith.

The following patents and published patent applications, which are hereby incorporated by reference herein in their entireties, describe suitable configurations for the 3D memory arrays configured as a plurality of levels, with wordlines and/or bitlines shared between levels: U.S. Pat. Nos. 7,679,133; 8,553,466; 8,654,587; 8,559,235; and US Pat. Pub. No. 2011/0233648. An NVM according to representative embodiments disclosed herein may be applied to not only a flash memory device in which a charge storage layer is formed of a conductive floating gate but also a charge-trap flash (CTF) memory device in which a charge storage layer is formed of an insulating layer.

The memory controller 220 is configured to control the NVM(s) 210. The memory controller 220 may include an error correction circuit (ECC) 222, which may include an LDPC encoder 222-1 to generate an ECC corresponding to information and an LDPC decoder 222-2 to receive a codeword (information+parity) and perform ECC correction. The LDPC decoder 222-2 may be implemented as the LDPC decoder 100 described above with reference to FIGS. 1 to 11. The codeword may be input to variable nodes of the VNU 120 (see FIG. 1).

In accordance with a representative embodiment, the LDPC decoder 222-2 includes at least one processor configured to perform decoding using a variable node update operation and a check node update operation as described above. The LDPC 222-2 includes the VNU 120 (see FIG. 1) configured to perform a variable node update operation from channel information and a check node message (C2V message), the CNU 140 (see FIG. 1) configured to perform a check node update operation from a variable node message (V2C), memory elements 170, an input/output (I/O) device, and the like.

In accordance with a representative embodiment, first memory elements store check node information for performing a check node update. In accordance with a representative embodiment, there is an interconnection between the first memory elements, and the sequence and/or position of the check node information stored in the first memory elements can be changed at each clock cycle. In accordance with a representative embodiment, an interconnection between the first memory elements may include two or more types of paths. In accordance with a representative embodiment, a method of shifting a sequence and/or position of check node information is changed at each clock cycle.

In accordance with a representative embodiment, the VNU 120 (see FIG. 1) and the CNU 140 have a fixed interconnection for message transmission.

In accordance with a representative embodiment, second memory elements store variable node information for performing variable node updates. In accordance with a representative embodiment, there is an interconnection between the second memory elements, and the sequence and/or position of the variable node information stored in the second memory elements can be changed at each clock cycle. In accordance with a representative embodiment, the interconnection between the second memory elements includes two or more types of paths. In accordance with a representative embodiment, a method of changing the sequence and/or position of the variable node information is changed at each clock cycle.

In some embodiments, channel information includes a channel log-likelihood ratio (LLR).

In some embodiments, a check node message includes a check-to-variable (C2V) message transmitted from a check node to a variable node. In some embodiments, a variable node message includes a variable-to-check (V2C) message transmitted from a variable node to a check node.

In some embodiments, the check node information includes a first minimum (min1), a second minimum (min2), a variable node index to transmit a first minimum message, and a sign multiplication of V2C message among the V2C message transmitted to a corresponding check node.

In some embodiments, each of the first memory elements includes a register. In some embodiments, the first memory elements are connected to each other to shift cyclic shift values through them. In some embodiments, the first memory elements are divided into a plurality of groups, or subsets, and memory elements of each of the groups are connected to each other to shift values in a cyclic shift form through them.

In some embodiments, the LDPC decoder 222-2 further includes control logic configured to select an interconnection between the first memory elements storing check node information at each clock cycle.

In some embodiments, the check node message includes a C2V message transmitted from a check node to a variable node. In some embodiments, the variable node message includes a V2C message transmitted from a variable node to a check node. In some embodiments, the variable node information includes a posterior probability (APP) or log-APP of a corresponding variable node.

In some embodiments, each of the second memory elements includes a register that stores check node information. In some embodiments, one of interconnections between memory elements storing the check node information may be implemented in a cyclic shift form to shift a value to an adjacent memory element. In some embodiments, one of interconnections between memory elements storing the check node information is divided into a plurality of groups and memory elements of each of the groups are connected to each other to shift a value in a cyclic shift form.

In some embodiments, the LDPC decoder 222-2 further includes control logic configured to select an interconnection between memory elements storing check node information at each clock cycle.

Figure 13:
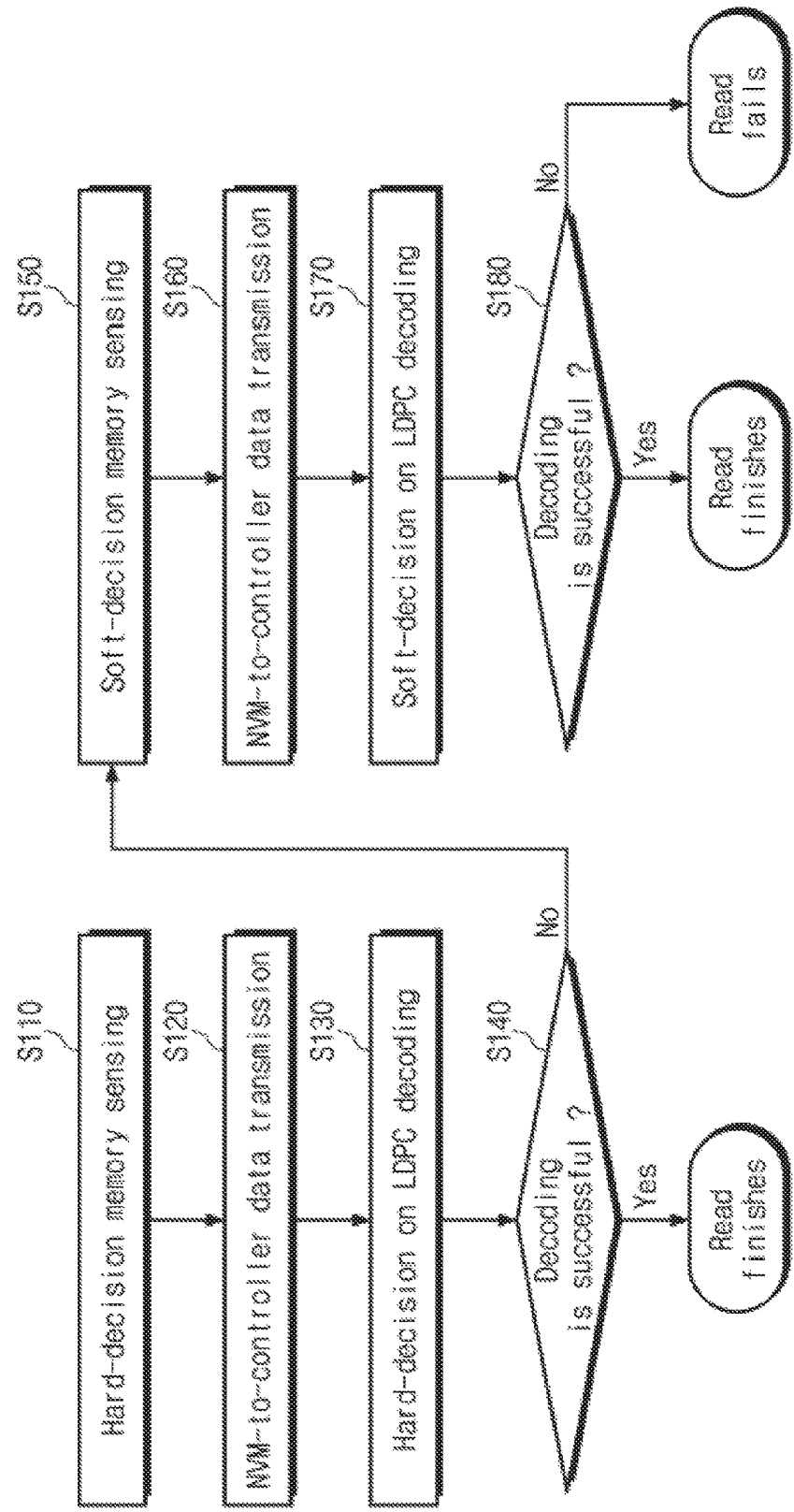
FIG. 13 illustrates a flow diagram representing a read operation performed by the storage device shown in FIG. 12.

FIG. 13 illustrates a flow diagram representing a read operation performed by the storage device 200 shown in FIG. 12. Referring to FIGS. 12 and 13, the read operation of the storage device 200 may be performed as follows.

In general, hard decision information includes only information on whether a reading value of a bit stored in a memory cell is 0 or 1. Meanwhile, soft decision information includes quantized reading information on a bit stored in a memory cell. For example, a value of soft decision information for a bit may include 0, 1, and a value between 0 and 1. The hard decision information including only information on whether a bit is 0 or 1 lacks reliability information, while soft decision information on a bit includes more reliability information and thus may be advantageous in error correction.

Hard decision memory sensing is performed, as indicated by block S110. Read data is transmitted from an NVM 210 to the error correction circuit 222 of the memory controller 220, as indicated by block S120. The LDPC decoder 222-2 of the error correction circuit 222 makes a hard decision using LDPC decoding on the read data, as indicated by block S130. A determination is made as to whether the hard decision was successfully made, as indicated by block S140). If the hard decision was successfully made, the read operation is complete. If the hard decision was not successfully made, the flow proceeds to block S150.

Soft decision memory sensing is performed at block S150. The read data is transmitted from the NVM 210 to the error correction circuit 222 of the memory controller 220, as indicated by block S160. The LDPC decoder 222-2 of the error correction circuit 222 performs a soft decision using LDPC decoding on the read data, as indicated by block S170. In some embodiments, the H matrix that is used in performing the LDPC decoding to make the soft decision is identical to the H matrix that is used in performing the LDPC decoding to make the hard decision. Alternatively, the H matrix that is used in performing the LDPC decoding to make the soft decision is different from the H matrix that is used in performing the LDPC decoding to make the hard decision. As described above, the H matrix may be variably determined or selected by combination of a total cyclic permutation and a partial cyclic permutation.

A determination is made as to whether the soft decision was successfully made, as indicated by block S180. If the soft decision was successfully made, the read operation is completed. If the soft decision was not successfully made, the read operation may be treated as failure, in which case additional read/rewrite operations may be performed.

Figure 14:
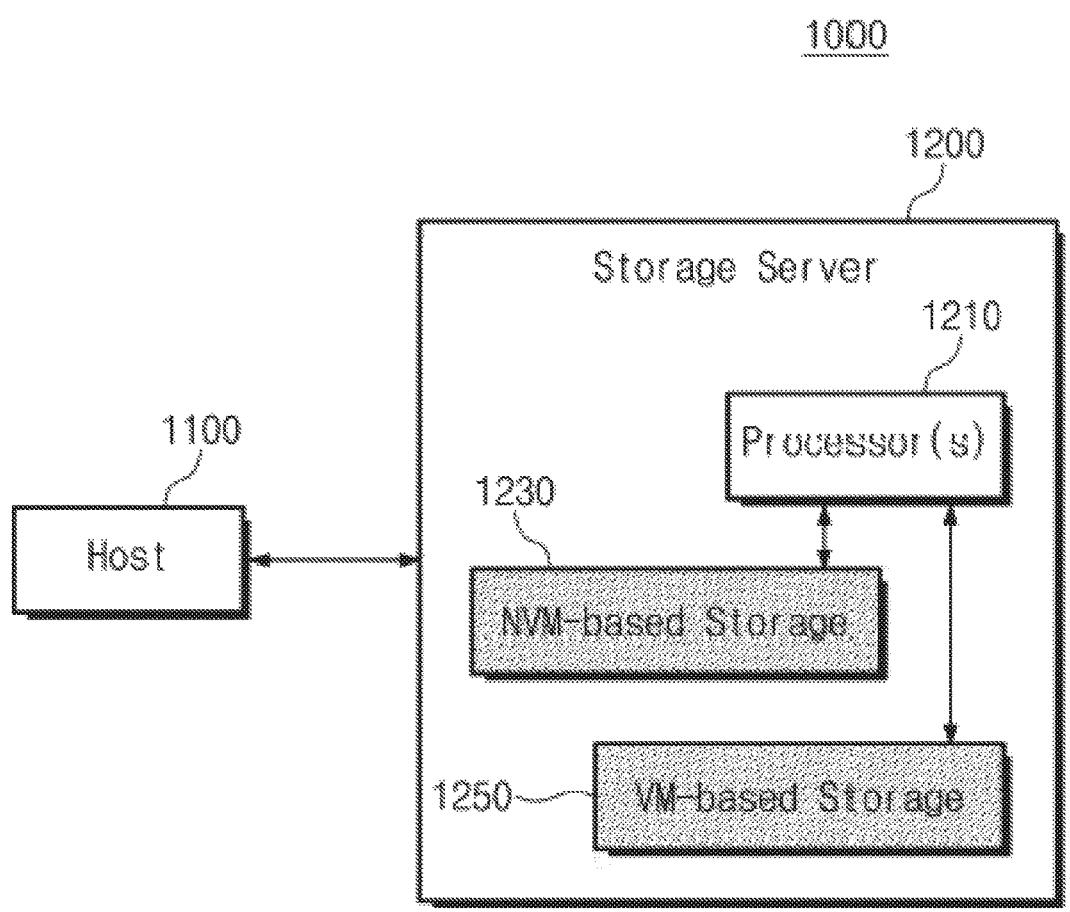
FIG. 14 illustrates a block diagram of an electronic system including a server employing an object storage according to a representative embodiments.

FIG. 14 illustrates a block diagram of an electronic system 1000 including a server employing object storage according to a representative embodiment. As illustrated, the electronic system 1000 includes a host 1100 and a storage server 1200.

The host 1100 provides a service to a user of the host 1100 according to operations of various electronic circuits/chips/devices included in the host 1100. For example, the host 1100 may perform various operations to process a command received from a user of the host 1100 and may provide an operation result to the user of the host 1100. To achieve this, the host 1100 may include, for example, an operation processor (e.g., a central processing unit (CPU), a graphic processing unit (GPU), an application processor (AP), etc.) including a specific-purpose logic circuit (e.g., a field programmable gate array (FPGA), an application specific integrated circuit (ASIC), etc.).

In accordance with this representative embodiment, the storage server 1200 includes a processor 1210, a nonvolatile memory-based storage 1230, and a volatile memory-based storage 1250. The storage server 1200 performs LDPC decoding or ECC functions described above with reference to FIGS. 1 through 12. For example, at least one of the nonvolatile memory-based storage 1230 and the volatile memory-based storage 1250 may be implemented to perform the above-described LDPC decoding method.

In some embodiments, at least one of the nonvolatile memory-based storage 1230 and the volatile memory-based storage 1250 includes an object storage. Unlike a block storage or a file storage, the object storage manages data based on a unique identifier of an object. For example, the object storage may receive specific data and a "key" corresponding to the specific data from the host 1100. The key uniquely identifies the specific data. When the amount of atypical data such as audio data or video data is large due to characteristics of the object storage, the object storage can manage data more efficiently than the block storage or the file storage.

As described above, the LDPC decoder 100 and 222-2 and a storage device including the LDPC decoder 100 and 222-2 select interconnections of memory elements 170 including variable node/check node information at each clock cycle to implement various supportable decoding matrices.

It should be noted that the inventive principles and concepts have been described with reference to a few representative embodiments and that the inventive principles and concepts are not limited to these embodiments. The representative embodiments are to be considered illustrative, and not restrictive, and the appended claims are intended to cover all such modifications, enhancements, and other features, that fall within the spirit and scope of inventive principles and concepts. Thus, to the maximum extent allowed by law, the scope of inventive principles and concepts is to be determined by the broadest permissible interpretation of the following claims and their equivalents, and shall not be restricted or limited by the foregoing detailed description. While some representative embodiments have been particularly shown and described, it will be understood by one of ordinary skill in the art, in view of the description provided herein, that variations in form and detail may be made to these embodiments without departing from the spirit and scope of the claims.

What is claimed is:

1. A low-density parity check (LDPC) decoder comprising:
   a variable node processor that receives channel information and check node information and calculates variable node information; and
   a check node processor that receives the variable node information and calculates the check node information, wherein the check node processor:
      comprises K>2 memory elements that provide a K-cycle cyclic permutation and L of the memory elements, where 1<L<K, provide an L-cycle cyclic permutation, and
      executes a first LDPC on data stored by the memory elements using the K-cycle cyclic permutation and the L-cycle cyclic permutation, wherein
   a number of cycles required to execute the first LDPC is smaller than a number of cycles required to execute a second LDPC on the data using only the K-cycle cyclic permutation.

2. The LDPC decoder of claim 1, wherein the channel information includes a channel log-likelihood ratio (LLR) for a codeword.

3. The LDPC decoder of claim 1, wherein:
   the check node processor comprises a plurality of check nodes and the variable node processor comprises a plurality of variable nodes, and
   each of some, but fewer than all, of the check nodes is interconnected with a different and corresponding one of the variable nodes.

4. The LDPC decoder of claim 3, wherein the variable node information includes a variable-to-check (V2C) message transmitted from a first variable node, among the variable nodes, to a first check node among the check nodes.

5. The LDPC decoder of claim 3, wherein the check node information includes a check-to-variable (C2V) message transmitted from a first check node, among the check nodes, to a first variable node among the variable nodes.

6. The LDPC decoder of claim 5, wherein the check node information includes a first minimum among C2V messages stored in the memory elements, a second minimum among the C2V messages, and position information of the first minimum.

7. The LDPC decoder of claim 1, wherein each of the cycles required to execute the first LDPC on the data with the LDPC decoder is executed using either a cycle of the K-cycle cyclic permutation or a cycle of the L-cycle cyclic permutation, but not a cycle of each of the K-cycle cyclic permutation and a cycle of the L-cycle cyclic permutation.

8. The LDPC decoder of claim 7, wherein the check node processor cycles the data stored by the memory elements through the K-cycle cyclic permutation and the L-cycle cyclic permutation using a dual diagonal form to execute the first LDPC on the data.

9. The LDPC decoder of claim 1, wherein each of the memory elements includes a register.

10. The LDPC decoder of claim 1, wherein:
L<M<K of the memory elements provide an M-cycle cyclic permutation, and
the check node processor executes the first LDPC on the data stored by the memory elements using the K-cycle cyclic permutation, the L-cycle cyclic permutation, and the M-cycle cyclic permutation.

11. A storage device comprising:
a nonvolatile memory (NVM) device that stores a codeword including information and a parity corresponding to the information; and
a memory controller including a low-density parity check (LDPC) decoder that reads the codeword from the NVM device and corrects an error of the codeword, wherein:
the LDPC decoder comprises:
a variable node processor that receives channel information and check node information corresponding to the codeword and updates variable node information; and
a check node processor that receives the variable node information and updates the check node information, and
the check node processor:
comprises K>2 memory elements that provide a K-cycle cyclic permutation and L of the memory elements, where 1<L<K, provide an L-cycle cyclic permutation; and
executes a first LDPC on data stored by the memory elements using the K-cycle cyclic permutation and the L-cycle cyclic permutation, wherein
a number of cycles required to execute the first LDPC is smaller than a number of cycles required to execute a second LDPC on the data using only the K-cycle cyclic permutation.

12. The storage device of claim 11, wherein the memory controller further includes an LDPC encoder that receives the information from an external device and generates the parity corresponding to the information.

13. The storage device of claim 11, wherein the LDPC decoder decodes the codeword to hard decision or decodes the codeword to soft decision.

14. The storage device of claim 13, wherein the LDPC decoder includes a first H matrix for hard decision decoding and a second H matrix for soft decision decoding.

15. The storage device of claim 12, wherein:
the check node processor includes a plurality of check nodes and the variable node processor includes a plurality of variable nodes, and
each of some, but fewer than all of the check nodes, is interconnected with a different and corresponding one of the variable nodes.

16. A method for performing a read operation in a storage device performing hard decision memory sensing in the storage device, the method comprising:
transmitting read data from a non-volatile memory (NVM) device of the storage device to an error correction circuit of a memory controller of the storage device;
in a low-density parity check (LDPC) decoder of the error correction circuit, using LDPC decoding to make a hard decision on the read data;
in the LDPC decoder, determining whether the hard decision was successfully made;
in response to determining that the hard decision was not successfully made, performing soft decision memory sensing on the read data;
transmitting the read data from the NVM device to the error correction circuit of the memory controller;
in the LDPC decoder of the error correction circuit, performing a soft decision using LDPC decoding on the read data; and
in the LDPC decoder, determining whether the soft decision was successfully made, wherein the LDPC decoder:
comprises K>2 memory elements that provide a K-cycle cyclic permutation and L of the memory elements, where 1<L<K, provide an L-cycle cyclic permutation,
executes a first LDPC on data stored by the memory elements using the K-cycle cyclic permutation and the L-cycle cyclic permutation, and
performs the first LDPC decoding to make the hard decisions and the soft decisions, wherein
a number of cycles required to execute the first LDPC is smaller than a number of cycles required to execute a second LDPC on the data using only the K-cycle cyclic permutation.

17. The method of claim 16, wherein the LDPC decoder uses H matrices, which are identical, to execute the first LDPC decoding.

18. The method of claim 16, wherein the LDPC decoder uses H matrices, which are different, to execute the first LDPC decoding.

* * * * *